METHOD FOR MAKING A SEMICONDUCTOR DEVICE

Filed April 16, 1963 2 Sheets-Sheet 1

Ernst Fröschle
Christian Steppat
Inventors
By: Spencer & Kaye
Attorneys

Ernst Fröschle
Christian Steppat
Inventors
By: Spencer & Kaye
Attorneys

United States Patent Office 3,287,239

Patented Nov. 22, 1966

3,287,239

METHOD FOR MAKING A SEMICONDUCTOR DEVICE

Ernst Fröschle, Stuttgart-Sillenbuch, Germany, and Christian Steppat, Bells Corners, Ontario, Canada, assignors to Telefunken Patentverwertungs-G.m.b.H., Ulm (Danube), Germany Filed Apr. 16, 1963, Ser. No. 273,359

Claims priority, application Germany, Apr. 16, 1962, T 21,976

13 Claims. (Cl. 204—143)

The present invention relates generally to the semi-conductor art, and, more particularly, to a method for mesa etching.

The use of what is known as mesa etching on semiconductor devices and wherein the semiconductor body has the conductivity type intended for the collector zone is known. The etching is performed in order to reduce the capacitance of the pn-junction on the collector side. That portion of the semiconductor body which is not to be etched is covered with a lacquer which is resistant to etching.

Experiments which have been performed concerning mesa etching processes have shown that when semiconductor devices which are not symmetrically constructed are mesa etched, asymmetrical and/or non-uniform etching is the result. An example of such an asymmetrical device is a so-called AD-transistor (alloyed-diffused transistor), wherein an emitter and a base electrode are inserted on one side of a semiconductor body which body has the conductivity type intended for the collector zone. In the case of the AD-transistor, the base zone is provided by diffusion out of the emitter pellet. In order to provide a low-ohmic connection between the base electrode and the base zone which is produced by diffusion out of the emitter pellet, the surface on the emitter side is provided with a surface diffusion layer having the conductivity type of the base zone, and this layer is effective as a low-ohmic connection between the base zone and the base electrode.

The asymmetry of such a device is due to the fact that there is only one pn-junction between the base electrode of the AD-transistor and its collector zone whereas two pn-junctions are provided between the emitter electrode and the collector zone. The pn-junction disposed in front of the base electrode is produced between the recrystallization zone of the base electrode and the collector body. Two pn-junctions are disposed between the emitter electrode and the collector body and are created due to the base zone which is disposed therebetween and the conductivity type of which is opposite to that of the emitter and collector zones.

Now, if mesa etching is used, there is the possibility that the diffused base zone may be etched to a greater extent than the other structure, and such etching causes an undesired reduction of the breakdown voltage of the pn-junction on the collector side; this is particularly the case if the diffused base zone is very thin. Furthermore, because of the undesired undercutting action of the etching, the resistance of the base zone is increased and the mechanical stability of the undercut emitter pellet is reduced.

With these defects of the prior art in mind, it is a main object of the present invention to provide a method for mesa etching wherein symmetrical etching may be performed even when the device to be etched is asymmetrical.

Another object of the present invention is to perform a simple and relatively inexpensive method for producing a mesa etched transistor and which is provided with the desired mechanical and electrical characteristics.

These objects and others ancillary thereto are accomplished according to preferred embodiments of the invention wherein non-uniform etching is prevented by at least partially short-circuiting the zones which are produced in a semiconductor body of the conductivity type of the collector zone.

In general, those zones produced in a semiconductor body which come in contact with the etching solution during the etching process are the ones to be short-circuited with one another. The short-circuiting of the semiconductor zones is accomplished by connecting the electrodes contacting the semiconductor zones to be short-circuited with one another in an electrically conductive manner.

The application of the present invention is particularly recommended in those cases wherein transistors are produced having the emitter and base zones coming in contact with the etching solution during the etching treatment. In this case, the emitter and the base electrodes are short-circuited with each other.

Although the present method is primarily for use with electrolytic etching processes, the method of the instant invention can also be used when chemical etching is performed.

In accordance with another feature of the invention, a potential which is negative with respect to the collector potential is applied to the short-circuited electrodes during the entire etching process or during only a part of the etching process. The application of a potential which is negative with respect to the collector potential to the short-circuited emitter and base electrodes results in an etching away of only the collector body and not the emitter and base zones. Therefore, if during the mesa etching process a negative potential is applied to the short-circuited emitter and base electrodes at the time when the etching front or forewardmost etched surface, considered from the emitter side, reaches the collector body—which occurs when the portions of the base and emitter zones which are not covered are just etched away—then the danger of a surface breakthrough can essentially be reduced since during further etching only the collector body is further constricted and thus the distance between the pn-junctions is effectively increased.

Additional objects and advantages of the present invention will become apparent upon consideration of the following description when taken in conjunction with the accompanying drawings in which.

Figure 1:
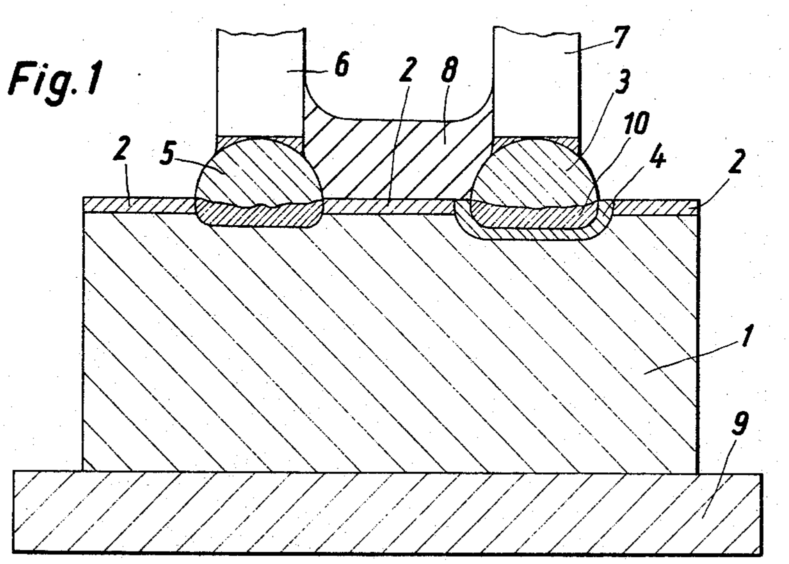
FIGURE 1 is a diagrammatic sectional view through an AD-transistor before mesa etching.

With more particular reference to the drawings, FIGURE 1 illustrates an AD- transistor before the mesa etching process. The transistor includes a semiconductor body 1 which has the conductivity type of the collector zone. On the emitter side of the body 1 of a low-ohmic diffusion layer 2 is provided which has the conductivity type of the base zone. On the other side of the semiconductor body, a metal block 9 is soldered to form the collector electrode. The emitter alloying pellet 3 is applied and during this process a recrystallization zone 10 is provided. The base zone 4 is produced by diffusion out of this recrystallization zone 10. Contacting of the base zone 4 is provided by a base pellet 5 which is connected with the base zone via the surface diffusion layer 2 in a low-ohmic manner. The base and emitter lead wires 6 and 7, respectively, are connected to their respective pellets. Before the mesa etching process is carried out, the semiconductor surface between the pellets 3 and 5 is covered with an etch-resistant lacquer 8.

Figure 2:
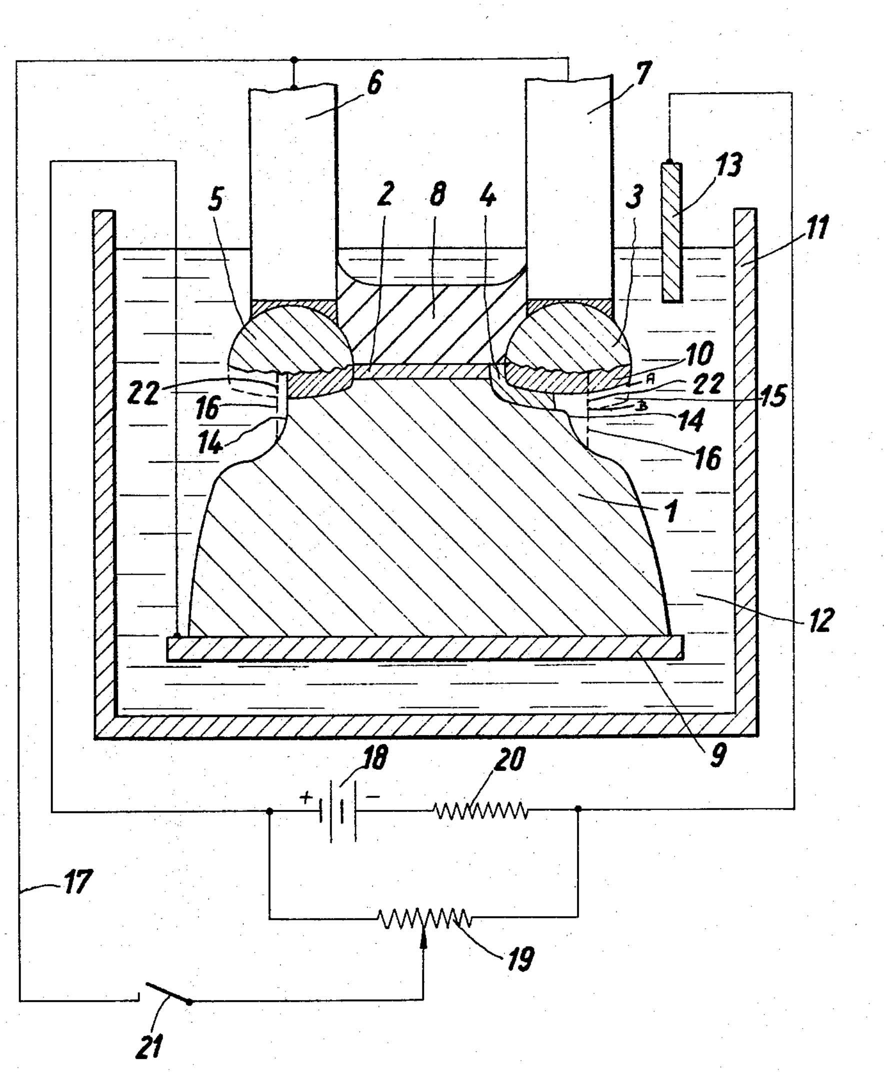
FIGURE 2 is a diagrammatic sectional view illustrating an AD-transistor and the apparatus used during the etching process and indicating in dashed lines the results obtained using the present invention, and indicating in solid lines the results obtained when the present invention is not used.

With more particular reference to FIGURE 2, an AD-transistor of the type described above in connection with FIGURE 1 is illustrated as being disposed in an electrolytic etching solution 12 contained in a vessel 11. If the collector body 1 via the collector electrode 9 and the electrode 13, which is immersed in the solution, are connected with the poles of a voltage source 18, a mesa etching process takes place, so that the etching which takes place is as indicated by the solid line 14. However, a mesa structure having the configuration of line 14 has the disadvantage that more material is etched away from the base zone 4 than from the emitter zone 10. This undesired etching away of portion 15 of the base zone can now be avoided in accordance with the present invention by short-circuiting the emitter and base electrodes to each other.

Actually, the etching which is desired should provide that the distance between the respective pn-junctions on the emitter and collector side, at those places where these junctions are at the periphery of the structure, for example, points A and B, be as large as possible. If this condition is fulfilled, then the danger of surface break-through is substantially less than in the case when the distance is smaller. If a mesa structure is provided with the configuration as indicated by the dashed line 16, a large spacing between these pn-junctions is provided. Such a mesa structure can be provided according to the present invention, if not only the base and emitter electrodes are short-circuited to each other, but if also a potential which is negative with respect to the collector potential is applied to the short-circuited electrodes. This is accomplished in FIGURE 2 utilizing a conductor or line 17 which applies a suitable potential to the two electrodes via a variable voltage divider 19. The resistance 20 which is in series with the voltage source 18 limits the etching current. In many cases, it is advantageous to apply the above-mentioned additional potential only after the base zone 2 has been etched away in those portions which are not protected by the lacquer covering. A switch 21 is provided for applying such a potential.

Figure 3:
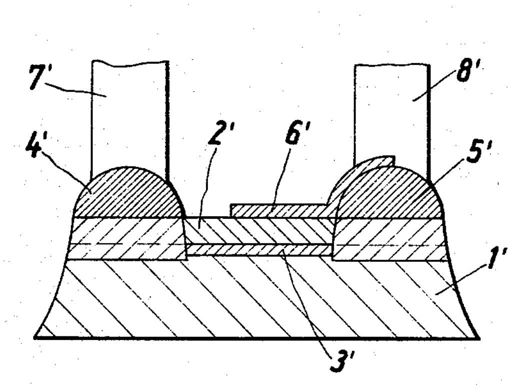
FIGURE 3 is a diagrammatic sectional view of an asymmetrical tetrode device.

FIGURE 3 illustrates a high frequency transistor which may act as a tetrode and wherein the semiconductor body 1′ is of the conductivity type of the collector zone. The emitter zone 2′ of this transistor is produced by an alloying operation, and the base zone 3′ which is disposed between the emitter zone and the collector zone or in front of the base zone, is provided by diffusion out of the emitter alloying zone 2′. The two alloying pellets 4′ and 5′ are alloyed into the semiconductor body for contacting the base zone. The base electrode 5′ is connected with the emitter zone 2′ to provide an electrically conductive connection, and this is accomplished by a metal layer or coating 6′, and thus is effective as the emitter electrode. In order to reduce the capacity of the pn-junction on the collector side, the transistor is provided with a mesa structure.

Figure 4:
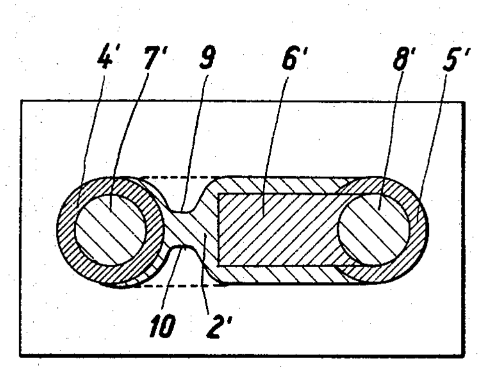
FIGURE 4 is a diagrammatic horizontal sectional view of the transistor illustrated in FIGURE 3.

The transistor described above thus becomes asymmetrical due to the metallic coating 6′. This asymmetry has, as experiments have shown, an adverse effect upon the mesa etching operation. FIGURE 4 illustrates the transistor of FIGURE 3 in plan view and illustrates the disadvantages which accompany this structure. When the mesa structure is etched undesired constrictions 9 and 10 are created in the base zone 2′ between the metal covering 6′ and the base electrode 4′. The electrode leads 7′ and 8′ are provided to contact the alloying electrodes 4′ and 5′, respectively.

In accordance with the present invention, the undesired constrictions 9 and 10 can be prevented as indicated in dashed lines if the emitter electrode 4′ is connected with the base electrode 5′ in an electrically conductive manner.

In addition, it is recommended that the electrodes which are short-circuited to each other be connected with a negative potential at the time the mesa etching has progressed to the extent that the uncovered portions of the emitter and base zone have been etched away. Finally in this connection the attention may be drawn to the fact that only by use of short-circuited electrodes without an additional potential already symmetrical etching may be achieved according to the line 22. However this etching has the disadvantage that parts of the emitter and of the base zone are etched away. This can be avoided by use of a potential which is applied to the electrodes 6 and 7.

An example of the present invention will now be given. The process to be described is carried out in an arrangement of the type illustrated in FIGURE 2. The semiconductor body 1 is of p-germanium. The diffusion layer 2 is produced by antimony vapor. Base zone 4 is produced by diffusing antimony out of recrystallization zone 10 which itself is gallium-doped. Base pellet 5 is made of lead-antimony alloy. Electrode 6 is connected to base pellet 5 and electrode 7 is connected to the emitter pellet 3 and these two electrodes are short-circuited to each other by means of conductor 17.

The transistor is placed in an etching solution of 30% potassium hydroxide and etching is carried out electrolytically for a period of about fifteen secs. with element 13 at −6 volts and 9 at 0 volt.

When the portions of layer 2 which are not covered with lacquer are etched away, switch 21 is closed to provide a voltage of −0.3 to zones 10 and 4, via conductor 17 and electrodes 6 and 7, and this is continued for a period of 15 seconds.

The dimensions of body 1 before etching are one times one times 0.3 $mm.^3$ and after etching the not reduced portion is $150 \times 50\mu$ and the height of the section which is etched away is $15\mu$.

It will be understood that the above description of the present invention is susceptible to various modifications, changes, and adaptations, and the same are intended to be comprehended within the meaning and range of equivalents of the appended claims.

What is claimed is:

1. In a method of making a mesa etched asymmetrical semiconductor device of the type wherein the semiconductor body has the conductivity type of the collector zone, which collector zone has a collector electrode connected directly thereto, and has a base zone disposed between said collector zone and an emitter zone, the improvement comprising electrolytically etching said device by applying an etching potential to said collector electrode while maintaining the zones produced in the semiconductor body at least partially short-circuited during etching by means of an electrical connection which is independent of the presence of any etching medium.

2. A method for producing a mesa etched, asymmetrical semiconductor device wherein the semiconductor body has the conductivity type intended as the collector zone, which collector zone has a collector electrode connected directly thereto, and has a base zone disposed between said collector zone and an emitter zone, said method comprising at least partially short-circuiting to each other the zones produced in the body by means of an electrical connection which is independent of the presence of any etching medium, and then electrolytically etching the body by applying an etching potential to said collector electrode.

3. A method for producing a mesa etched asymmetrical semiconductor device comprising forming in a semiconductor body of one conductivity type, and having a first zone having a collector electrode directly connected thereto, a second zone of the same conductivity type and a third zone of the other conductivity type disposed between said first and second zones for separating said first and second zones, short-circuiting said second and third zones by means of an electrical connection which is independent of the presence of any etching medium, and then electrolytically etching the device by applying an etching potential to said collector electrode.

4. A method as defined in claim 3 comprising for at least a portion of the etching step placing the short-circuited zones at a potential which is negative with respect to said etching potential applied to said first zone.

5. A method as defined in claim 3 wherein said etching step includes immersing the device in an electrolytic bath and connecting a source of potential between an electrode in the bath and said collector electrode thereby to electrolytically etch the device, and further comprising for at least a portion of the etching step placing the short-circuited zones at a potential which is negative with respect to said etching potential.

6. In a method of making an asymmetrical mesa transistor of the type wherein the semiconductor body has the conductivity type of the collector zone, which collector zone has a collector electrode directly connected thereto, and has a base zone disposed on said collector zone and connected to an emitter zone, the improvement comprising electrolytically etching said transistor by applying an etching potential to said collector electrode while maintaining at least some of the zones produced in the semiconductor body short-circuited during etching by means of an electrical connection which is independent of the presence of an etching solution.

7. A method as defined in claim 6 wherein only those zones are short-circuited which come in contact with the etching solution during etching.

8. A method as defined in claim 6 wherein the electrodes contacting the zones to be short-circuited are connected together in an electrically conductive manner.

9. A method as defined in claim 7 wherein during etching the zones intended as the emitter and base zones come in contact with the etching solution.

10. A method as defined in claim 6 wherein the zones intended as the emitter and base zones are short-circuited to each other.

11. A method as defined in claim 6 wherein during etching the positive pole of a voltage source is connected with the collector electrode and the negative pole of this voltage source is connected with an electrode immersed in the etching solution.

12. A method as defined in claim 6 comprising applying to the short-circuited zones for at least part of the time that etching is performed a potential which is negative with respect ot the collector electrode potential.

13. A method as defined in claim 12 wherein the negative potential is applied to the short-circuited zones only when the etching front on the emitter side reaches the collector body.

References Cited by the Examiner

UNITED STATES PATENTS

| | | | |
|---|---|---|---|
| 2,757,323 | 7/1956 | Jordan et al. | 204—143 |
| 3,072,514 | 1/1963 | Jochems et al. | 204—143 |

JOHN H. MACK, *Primary Examiner.*

R. MIHALEK, *Assistant Examiner.*